United States Patent [19]
Fox et al.

[11] Patent Number: 5,343,171
[45] Date of Patent: Aug. 30, 1994

[54] CIRCUIT FOR IMPROVING CARRIER REJECTION IN A BALANCED MODULATOR

[75] Inventors: Timothy R. Fox, Chicago; Jerry C. Posluszny, Stickney, both of Ill.

[73] Assignee: Kabushiki Kaish Toshiba, Kanagawa, Japan

[21] Appl. No.: 951,273

[22] Filed: Sep. 28, 1992

[51] Int. Cl.$^5$ .................................... H03C 1/54
[52] U.S. Cl. .......................... 332/167; 332/172; 455/323
[58] Field of Search ............... 332/159, 167, 123–128, 332/160–162, 168, 169, 172, 178; 455/118, 131, 326, 108–113, 323; 328/15, 166, 167

[56] References Cited

U.S. PATENT DOCUMENTS

| | | | |
|---|---|---|---|
| 3,426,283 | 2/1969 | Thor, Jr. | 328/166 |
| 3,913,037 | 10/1975 | Himono et al. | 332/172 X |
| 3,916,346 | 10/1975 | Wittlinger | 332/149 |
| 4,243,955 | 1/1981 | Daniel et al. | 332/167 |
| 4,766,400 | 8/1988 | Fox | 332/107 |
| 4,769,605 | 9/1988 | Fox | 324/322 |
| 4,868,528 | 9/1989 | Prevot et al. | 332/172 X |
| 5,020,076 | 5/1991 | Cahill et al. | 332/103 X |

Primary Examiner—Davis Mis
Attorney, Agent, or Firm—Finnegan, Henderson, Farabow, Garrett & Dunner

[57] ABSTRACT

A carrier rejection circuit for improving carrier rejection in a balanced modulator includes balun transformers, connected to the carrier signal port and the modulated signal port, which reduces parasitic carrier leakage by reducing the average voltages at the ports, offset adjustment circuitry, connected to the modulating signal port, which applies an adjustable offset voltage to the modulating signal to reduce in-phase parasitic carrier leakage and carrier leakage caused by offset voltage at the modulating port, and a reactance network, connected between the carrier signal port and the modulated signal port, for reducing quadrature-phase parasitic carrier leakage.

23 Claims, 6 Drawing Sheets

CIRCUIT FOR IMPROVING CARRIER REJECTION IN A BALANCED MODULATOR

BACKGROUND OF THE INVENTION

1. Field of the Invention

The present invention relates to balanced modulators, and, more particularly, to a carrier rejection circuit for reducing

2. Description of the Related Art

Figure 1:
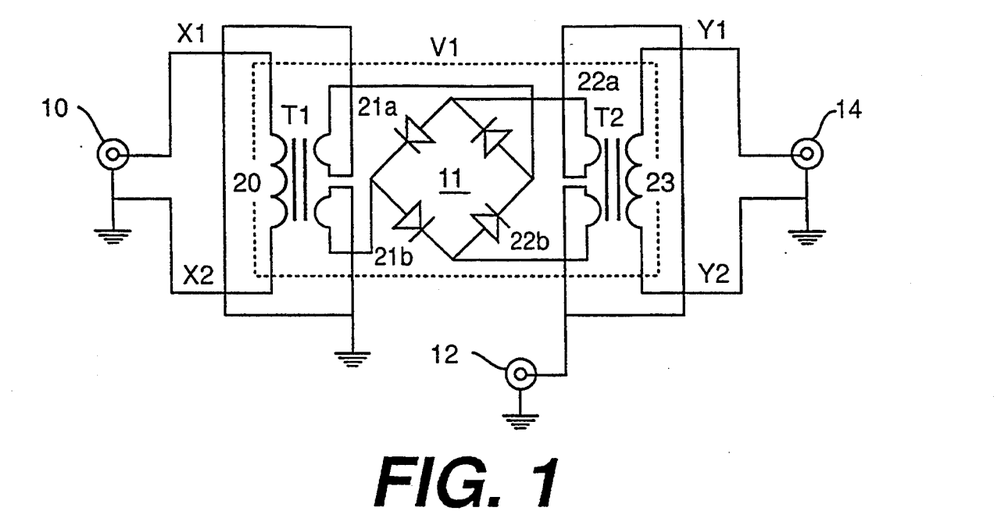
FIG. 1 is a schematic diagram of a diode-ring modulator circuit.

A modulator circuit modulates a high-frequency carrier waveforth according to a modulating waveform to produce a modulated output signal. As shown in FIG. 1, such a modulator circuit includes a carrier signal port 10 to which a carrier signal LO(t) is applied, a modulating signal port 12 for receiving a modulating signal IF(t), and a modulated signal port 14 at which the modulated signal RF(t) is produced.

An ideal balanced modulator is one in which the modulated signal RF(t) is identically=0 when the voltage of the modulating signal IF(t)=0, regardless of the voltage of the carrier signal LO(t). Thus, in the ideal balanced modulator, a modulating signal IF(t)=0 will produce a modulated signal RF(t)=0, even if the carrier signal LO(t) is, for example, a normal sine wave.

Like the ideal balanced modulator, an ideal double-balanced modulator will produce a modulated signal RF(t)=0 when a modulating signal IF(t)=0 is applied. In addition, the ideal double-balanced modulator produces a modulated signal RF(t)=0 when the carrier signal LO(t)=0, independent of the modulating signal IF(t).

In practice, however, a balanced modulator circuit will produce an undesired modulated signal RF(t) even though the modulating signal IF(t)=0. As an example, an analog multiplier is one type of modulator that can be easily analyzed. The modulated signal RF(t) of the ideal analog multiplier modulator can be represented by the following equation:

$$RF(t) = k \times LO(t) \times IF(t) \qquad (1)$$

where k is the gain constant of the multiplier. According to the above equation, it is apparent that the ideal multiplier is a double-balanced modulator, since RF(t)=0 when either LO(t) or IF(t)=0. However, if the practical multiplier circuit is subjected to a DC offset voltage VD at the modulating signal port 12, the above equation becomes:

$$RF(t) = k \times LO(t) \times [IF(t) + VD] \qquad (2)$$

As a result, even if the modulating signal IF(t)=0, carrier leakage will occur due to the offset voltage VD, producing an undesirable modulated signal represented by:

$$RF(t) = k \times LO(t) \times VD \qquad (3)$$

Another source of carrier leakage is parasitic coupling from the carrier signal port 10 to the modulated signal port 14 that is not coupled via the modulating circuit. For example, such parasitic coupling may be caused by stray capacitance, mutual inductance, or conductance effectively connected between the carrier signal port 10 and the modulated signal port 14.

In the case of carrier leakage caused by DC offset, if the carrier signal LO(t)=A×sin(wt), for example, the carrier leakage will be proportional to sin(wt), as evident from equation (3) above. This type of carrier leakage can be referred to as "in-phase" leakage. For parasitic coupling caused by stray capacitance, however, the carrier leakage will include a component proportional to cos(wt) resulting in "quadrature-phase" leakage. Parasitic in-phase leakage caused by conductance, for example, may be canceled by adjusting the offset voltage VD away from zero. However, because sine and cosine waves at the same frequency are linearly independent, it is not possible to cancel both the in-phase and quadrature-phase leakage terms by merely adjusting the offset voltage VD.

SUMMARY OF THE INVENTION

The present invention has been made in view of the above circumstances and has as an object the reduction of carrier leakage in a balanced modulator caused by DC voltage offset at the modulating signal port, and by parasitic coupling due to stray capacitance, mutual inductance, or effective conductance between the carrier signal port and the modulated signal port.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the above objects and in accordance with the purpose of the invention, as embodied and broadly described herein, the invention comprises a carrier rejection circuit for improving carrier rejection in a balanced modulator, the balanced modulator including a carrier signal port for receiving a carrier signal, a modulating signal port for receiving a modulating signal, and modulating means for modulating the carrier signal according to the modulating signal to generate a modulated signal at a modulated signal port. The carrier rejection circuit includes balance means, connected to the carrier signal port and the modulated signal port, for balancing the carrier signal and the modulated signal with respect to a ground potential. The balance means reduces parasitic carrier leakage between the carrier signal port and the modulated signal port by reducing the average voltages at the carrier signal port and the modulated signal port. Offset means, connected to the modulating signal port, applies an adjustable offset voltage to the modulating signal to reduce carrier leakage caused by offset voltage at the modulating signal port and in-phase parasitic carrier leakage between the carrier signal port and the modulated signal port. Reactance network means is connected between the carrier signal port and the modulated signal port, for reducing quadrature-phase parasitic carrier leakage between the carrier signal port and the modulated signal port.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate the embodiments of the invention and together with the description, serve to explain the principles of the invention.

DESCRIPTION OF THE PREFERRED EMBODIMENTS

Reference will now be made in detail to the presently preferred embodiment of the invention, examples of which are illustrated in the accompanying drawings. Wherever possible, the same reference numbers are used throughout the drawings to refer to the same or like parts.

A carrier rejection circuit in accordance with the present invention improves carrier rejection in a balanced modulator. A common type of balanced modulator circuit is the diode-ring modulator U1, shown in FIG. 1. The conventional diode-ring modulator circuit will be used in this specification, for purposes of example only, to describe the carrier rejection circuit of the present invention. As shown in FIG. 1, a typical diode-ring modulator circuit U1 includes an input transformer T1 which receives a carrier signal LO(t) applied to carrier signal port 10 and an output transformer T2, coupling the modulated signal RF(t) to modulated signal port 14, for producing the modulated signal RF(t). Input terminals X1 and X2 couple the carrier signal applied to carrier signal port 10 to the diode-ring 11 of the diode-ring modulator circuit U1 via input primary winding 20 and input secondary windings 21a and 21b. Similarly, output primary windings 22a and 22b and output secondary winding 23 couple the output of diode-ring 11 to output terminals Y1 and Y2, connected to modulated signal port 14. Input secondary windings 21a and 21b and output primary windings 22a and 22b are also coupled to the modulating signal port 12 to receive modulating signal IF(t).

In operation, the carrier signal LO(t) applied to diode-ring 11 switches the diodes on and off at the LO(t) frequency. During switching, the polarity of the connection between the modulating signal port 12 and the modulated signal port 14 is reversed, producing the same effect as if a square wave (+1 and −1) were applied to the carrier signal port of a multiplier modulator circuit, for example. In fact, if the modulated signal RF(t) of the diode-ring modulator 11 were passed through a suitable band-pass filter, the final output would be the same as that of a multiplier modulator circuit having a constant-amplitude sine wave applied to the carrier signal port. Like the ideal multiplier modulator, the ideal diode-ring modulator is double-balanced. However, the practical diode-ring modulator suffers from the same offset and leakage problems present in the practical multiplier modulator.

Commercially available diode-ring modulators are typically designed to operate with 50-ohm terminations at each of the carrier signal, modulating signal, and modulated signal ports. If the modulated signal port 14 and modulating signal port 12, shown in FIG. 1, are terminated with 50-ohm resistors, then the voltage at the modulated signal port 14 should be zero when the carrier signal port 10 is driven with a high-frequency sine wave from a 50-ohm source. For commercial devices, however, the leakage from the carrier signal port 10 to the modulated signal port 14 is an important specification. Typical leakage values in such devices are in the range of 30 to 50 dB isolation. Accordingly, a +7 dBm (5 mW) signal applied to the carrier signal port 10 will produce from −23 dBm (5000 nW) to −43 dBm (50 nW) at the modulated signal port 14. Because it is desirable to use the modulator with output levels below approximately −13 dBm to maintain good linearity, the specified carrier leakage of the device may be undesirably large relative to the modulated output signal.

Figure 2:
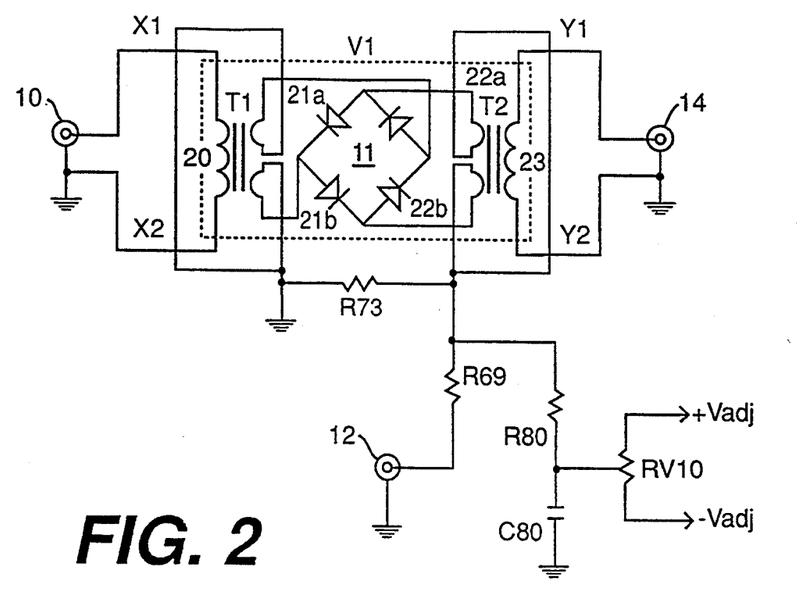
FIG. 2 is a schematic diagram of the modulator circuit of FIG. 1 incorporating DC offset adjustment circuitry in accordance with the present invention.

One method for adjusting the DC offset of the diode-ring modulator U1 is the connection of offset means to the modulating signal port. The offset means apply an adjustable offset voltage to the modulating signal to reduce carrier leakage caused by offset voltage and in-phase parasitic carrier leakage between the carrier signal port and the modulated signal port. As illustrated in FIG. 2, the offset means may include resistors R73, R69, and R80 having values selected to present a resistance of approximately 50 ohms to the modulating signal connections of the diode-ring modulator U1. A potentiometer RV10 varies the current through R80 to add a small DC voltage to the modulating signal applied to the modulating signal port 12. This DC offset configuration provides some improvement over the leakage characteristics of the basic 50-ohm terminated condition.

An additional measure for improving carrier leakage in a balanced modulator is the incorporation of balance means. When connected at the carrier signal port and the modulated signal port, the balance means balances the carrier signal and modulated signal with respect to ground to reduce parasitic carrier leakage by reducing the average voltages at the carrier signal port and the modulated signal port. In the embodiment illustrated in FIG. 3, the balance means includes balun transformers BT1 and BT2 connected at the input and output, respectively, of diode-ring modulator U1 to balance the voltages with respect to ground at the carrier signal input transformer T1 and at the modulated signal output transformer T2. In the modulator circuits illustrated in FIGS. 1 and 2, one of the two connections at each port is grounded. As a result, the voltages at all three ports are unbalanced. With the addition of balun transformers BT1 and BT2, however, parasitic coupling in the modulator circuit can be decreased by reducing the average voltages, with respect to ground, of the carrier signal port 10 and the modulated signal port 14.

Figure 3:
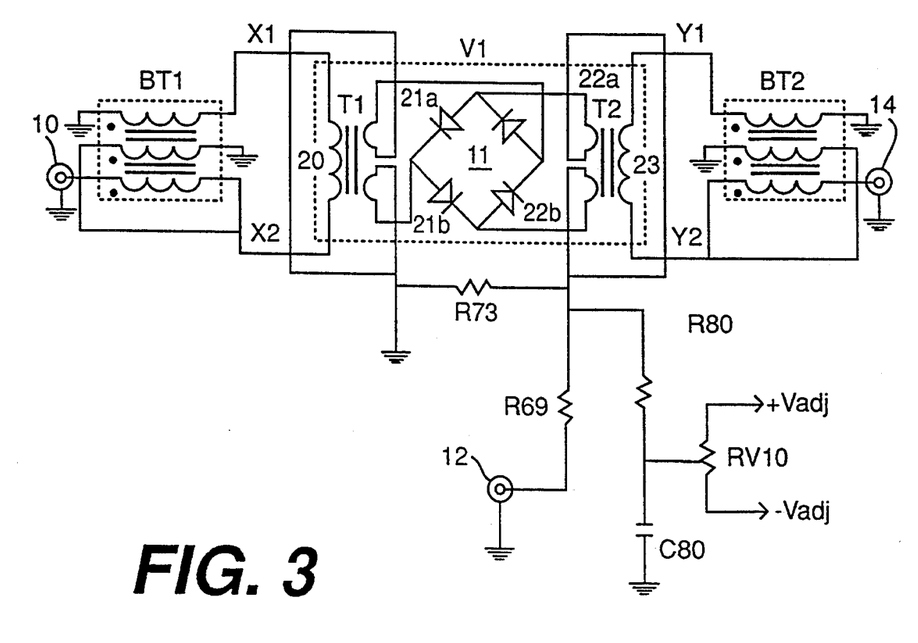
FIG. 3 is a schematic diagram of the modulating circuit of FIG. 2 further incorporating balun transformers in accordance with the present invention.
Figure 4:
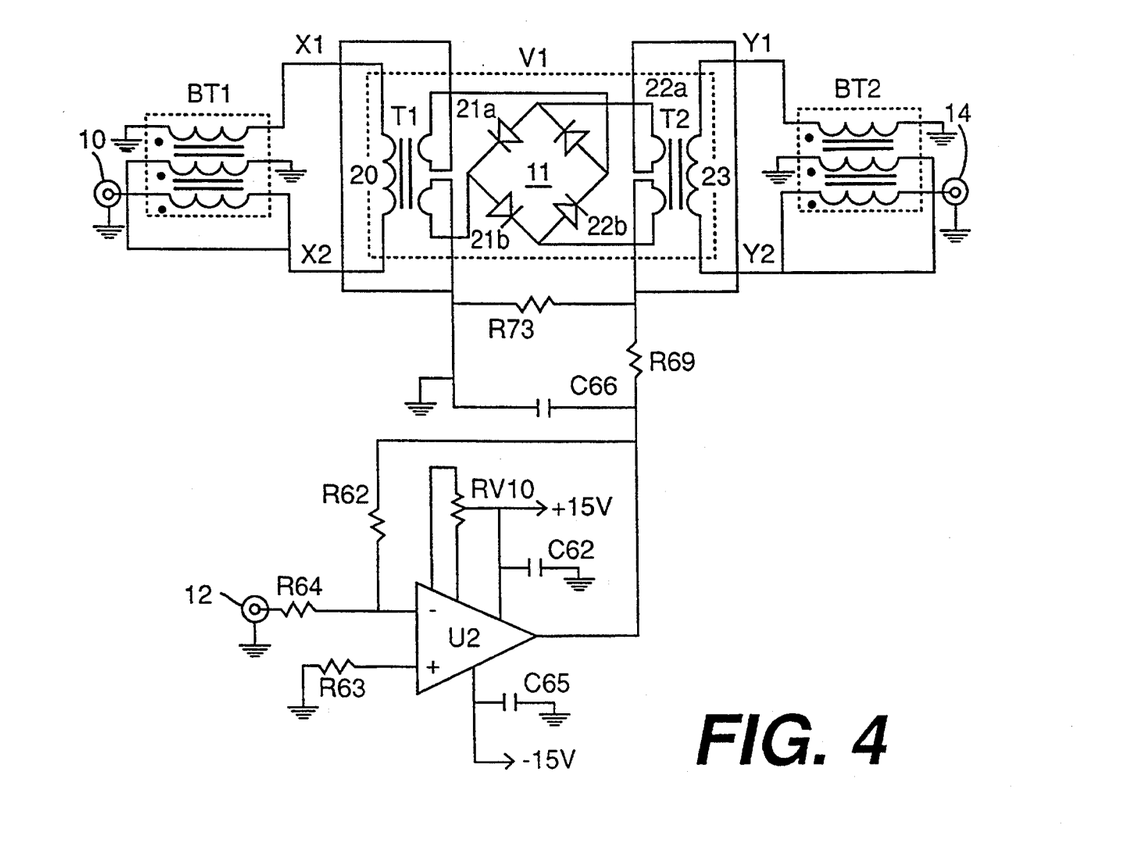
FIG. 4 is a schematic diagram of the modulating circuit of FIG. 3 modified in accordance with the present invention to incorporate an operational amplifier with DC offset adjustment.

FIG. 4 illustrates a further modification of the modulator circuit of FIG. 3 in which the offset means comprises an operational amplifier U2 with DC offset adjustment for coupling the modulating signal to the double-balanced modulator U1. Associated with the operational amplifier U2 are resistor R63, coupling the non-inverting input of operational amplifier U2 to ground, resistor R64, coupling the inverting input to modulating port 12, resistor R62, providing a negative feedback path and calculated for a predetermined gain, variable resistor RV10, for adjusting the DC offset of operational amplifier U2, and capacitors C62, C65, and C66, for transient suppression. Variable resistor RV10 is adjusted to control the DC offset of operational amplifier U2. In operation, the adjusted DC offset is added to the modulating signal applied to modulating port 12.

Suppression of carrier leakage can be substantially improved in the double-balanced modulator circuit by the use of the balancing and DC offset adjustment techniques discussed above. However, even with good balance and the best possible DC offset adjustment, undesirable carrier leakage remains to some degree. To cancel this remaining carrier leakage, the present invention provides an additional degree of freedom in the form of a variable reactance which enables adjustment of the "quadrature phase" component of the carrier leakage. In the present invention, the variable reactance is provided by reactance network means, connected for reducing quadrature-phase carrier leakage between the carrier signal port and the modulated signal port.

The use of capacitor networks has been proposed in a different context to cancel coupling between channels of a quadrature antenna coil, as described in U.S. Pat. No. 4,769,605 issued to T.R. Fox. In that context, a capacitor network was used to cancel coupling between two resonant circuits. In the present invention, a variable reactance network cancels carrier leakage between two resistive terminations.

Figure 5:
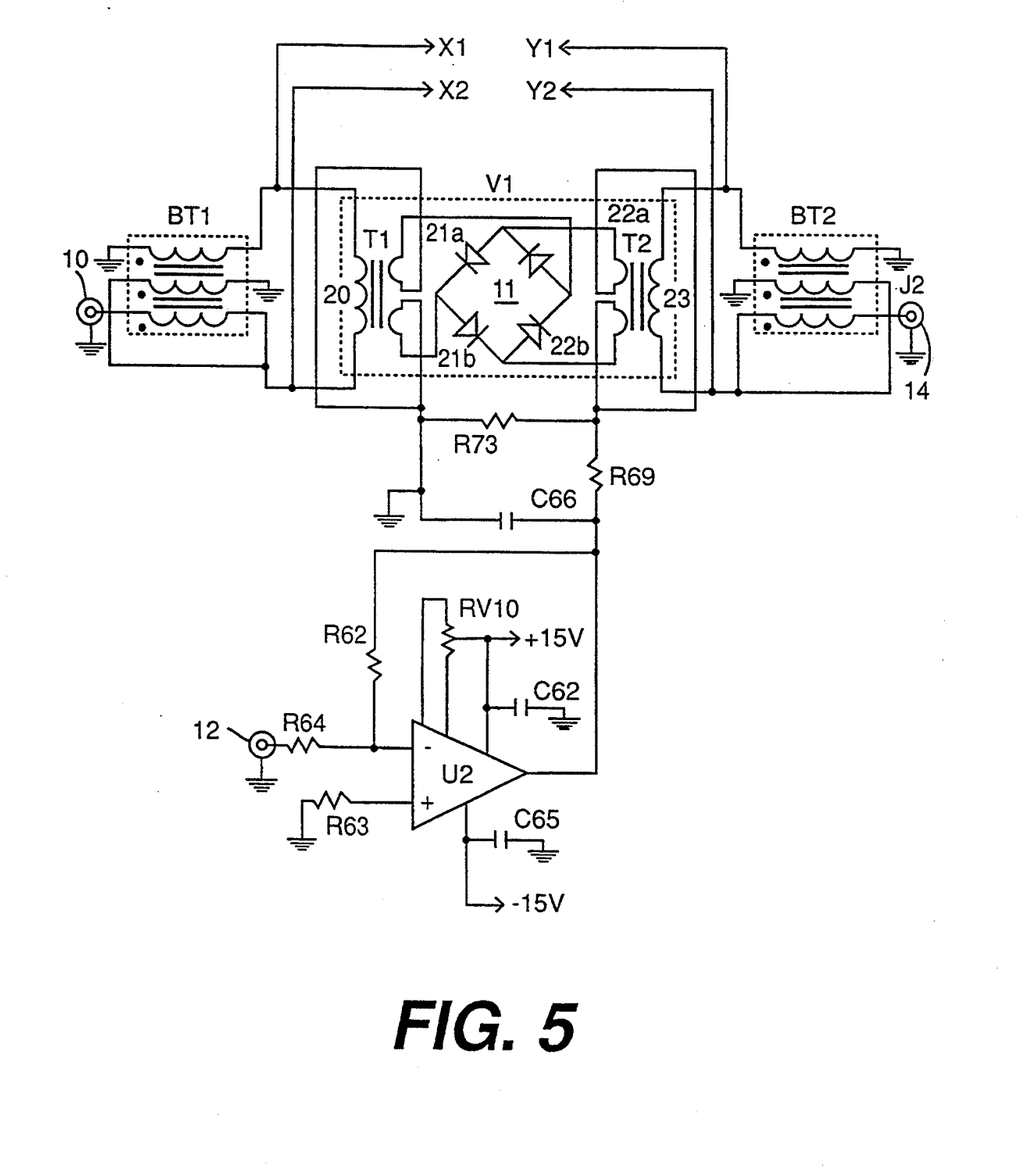
FIG. 5 is a schematic diagram of the modulating circuit of FIG. 4 incorporating input and output connection terminals for the variable reactance network of the present invention.

In accordance with the present invention, FIG. 5 shows the circuit of FIG. 4 with two pairs of terminals, X1, X2 and Y1, Y2, for connection to the reactance network means. FIGS. 6a–6f illustrate a variety of reactance network means, according to the present invention, which are suitable for connection to terminal pairs X1, X2 and Y1, Y2.

Figure 6A:
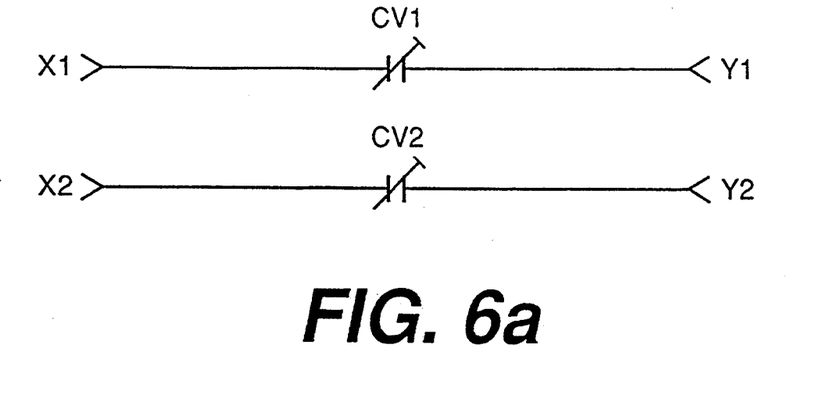
FIGS. 6a–6f are schematic diagrams of particular embodiments of the variable reactance network of the present invention.

As illustrated in the embodiment of FIG. 6a, the reactance network means may comprise a simple network including two variable capacitors CV1, connected between input terminal X1 and output terminal Y1, and CV2, connected between input terminal X2 and output terminal Y2. In practice, the reactances of the two variable capacitors CV1 and CV2 are varied together so as to be equivalent. If the reactance of either capacitor is substantially larger than the 50-ohm termination resistance at the ports, the voltage coupled through the capacitor to the termination will undergo a phase shift of approximately 90 degrees, providing a quadrature-phase, cosine wave. Varying the capacitances of the two capacitors CV1, CV2 will vary the magnitude of the cosine wave at the modulated signal port 14. Therefore, if the capacitances of capacitors CV1 and CV2 are adjusted to produce a cosine wave equal in magnitude and opposite in polarity to the cosine component of the original parasitic leakage, the total cosine voltage will be canceled.

However, because the capacitance of the network of FIG. 6a is always positive, the magnitude of the cosine voltage coupled through the capacitors CV1 and CV2 cannot be reduced to zero. For the same reason, the polarity of the coupled cosine voltage cannot be reversed. The latter problem can be treated by merely reversing the connections to one of the terminal pairs X1, X2 and Y1, Y2 when it is necessary to invert the polarity. This approach is effective because the voltages at each of the two terminal pairs are balanced with respect to ground by the balun transformers BT1 and BT2. Thus, with balun transformers BT1 and BT2, both positive and negative voltages can be coupled via the reactance network. This would not be possible with the unbalanced circuits of FIGS. 1 and 2.

Figure 6B:
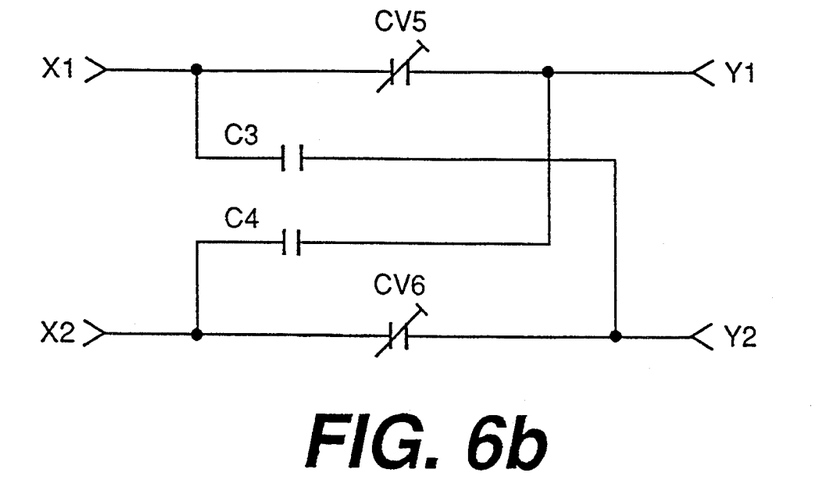

Although the terminal connections can be reversed in the network of FIG. 6a to produce positive and negative coupling voltages, this approach requires the added complexity of a switch or changeable connections. To avoid the need for such elements, the reactance network means may comprise a fixed network, provided by capacitors C3 and C4, and a variable network, including capacitors CV5 and CV6, as illustrated in FIG. 6b. In this embodiment, the fixed network is connected to terminal pairs X1, X2 and Y1, Y2 with a polarity opposite to that of the variable network. As a result, the net current flowing from terminal pair X1, X2 to terminal pair Y1, Y2 is the difference between the current through the variable capacitors and the current through the fixed capacitors. If the effective capacitance of fixed capacitors C3 and C4 is between the minimum and maximum effective capacitance of variable capacitors CV5 and CV6, the net current can be reversed and adjusted to zero. Thus, the network shown in FIG. 6b accommodates both problems present in the network of FIG. 6a, without the incorporation of additional switching circuitry.

Figure 6C:
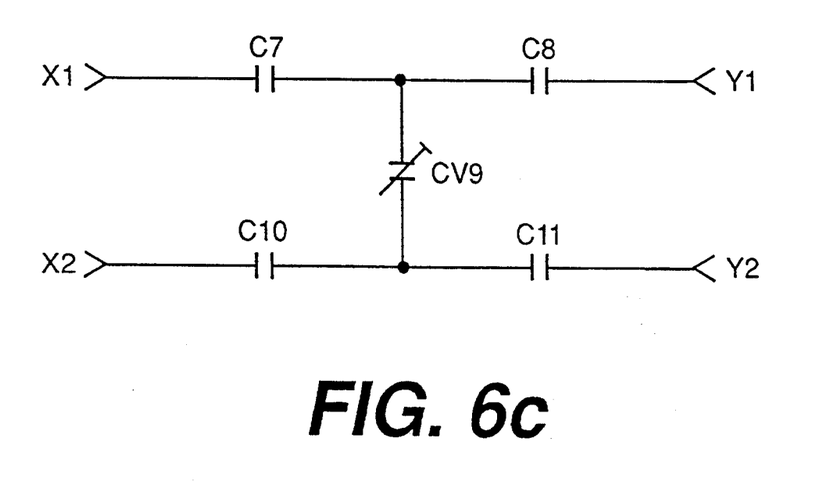

In the embodiment shown in FIG. 6c, the reactance network means is a balanced "Tee" network consisting of fixed capacitors C7, C8, C10, and C11, and variable capacitor CV9. In this network, capacitive coupling can be varied by merely adjusting the variable capacitor CV9. In addition, the network of FIG. 6c is useful in generating very small effective capacitances with precision, using practically sized components. This network is described in detail in the aforementioned U.S. Pat. No. 4,769,605 issued to T.R. Fox, which is incorporated herein by reference.

Figure 6D:
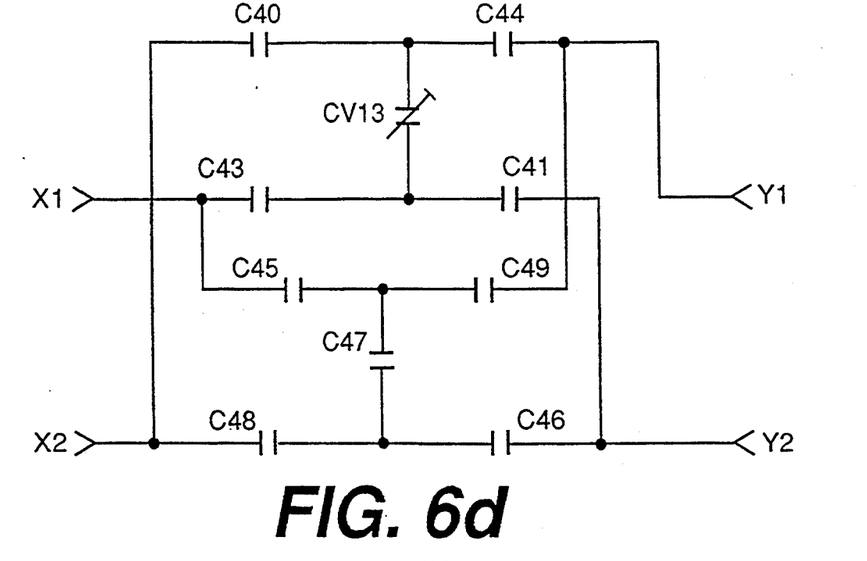

In the embodiment shown in FIG. 6d, the reactance network means is a variable balanced Tee network of one polarity, consisting of capacitors C40, C41, C43, C44, and variable capacitor CV13, in combination with a fixed balanced Tee network of an opposite polarity, made up of capacitors C45, C46, C47, C48, and C49. If the effective capacitance of the fixed balanced Tee network is midway between maximum and minimum capacitances of the variable balanced Tee network, the coupled voltage of this network can be adjusted from a negative value through zero to a positive value by merely varying the value of variable capacitor CV13. Thus, no terminal connection changes are necessary.

Figure 6E:
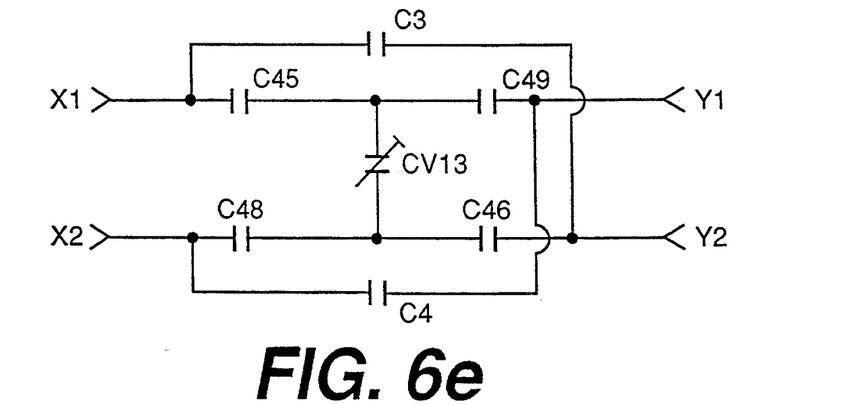
Figure 6F:
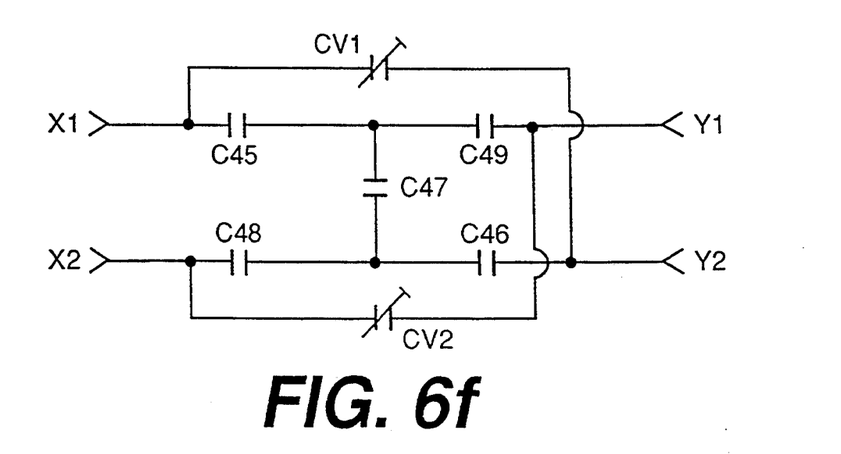

FIGS. 6e and 6f illustrate additional embodiments of the reactance network means of the present invention. For example, the reactance network means of FIG. 6e comprises a variable balanced "Tee" network, consisting of variable capacitor CV13 and capacitors C45, C46, C48, and C49, in combination with capacitor C3, connected between the first input terminal and the second output terminal, and capacitor C4, connected between the second input terminal and the first output terminal. In the embodiment of FIG. 6f, capacitors C45, C46, C47, C48, and C49 constitute a fixed balanced "Tee" network, and capacitors CV1 and CV2 are variable.

In an exemplary implementation of the carrier rejection circuit of the present invention, a reactance network means corresponding to that shown in FIG. 6d was connected to a commercially available balanced modulator, model SBL-1, manufactured by Mini-Circuits Division of Scientific Components Corporation. For a carrier signal frequency of approximately 13 MHz, capacitor values found to be suitable in the reactance network means of FIG. 6d were as follows:

C40, C41, C43, C44, C45, C46, C48, C49: 1.5 pF
C47: 12 pF
CV13: 7 to 40 pF

Figure 7:
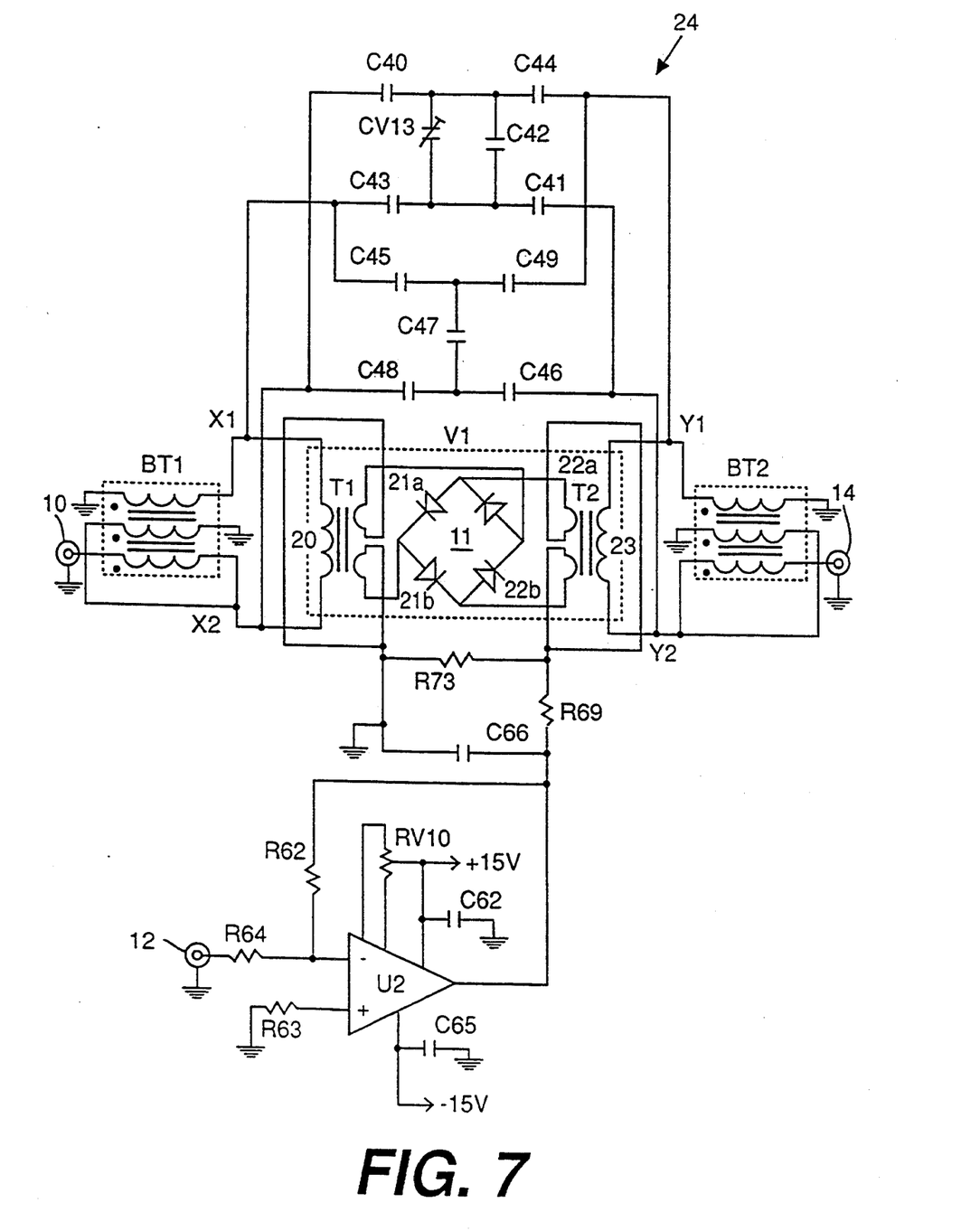
FIG. 7 is a schematic diagram of the modulating circuit of FIG. 5 incorporating a particular embodiment of the variable reactance network of the present invention.

FIG. 7 is an example of a particular embodiment of the carrier rejection circuit of the present invention incorporating the balance means, offset means, and reactance network means. This embodiment combines a reactance network conforming substantially to that shown in FIG. 6d with the balun transformers and DC offset adjustment circuitry of FIG. 5 to realize a carrier rejection circuit providing enhanced carrier leakage rejection. In the reactance network 24 of FIG. 7, an additional fixed capacitor C42 may be connected in parallel with variable capacitor CV13, if needed to obtain a particular range of variable capacitance with a commercially available variable capacitor CV13. In operation of the carrier rejection circuit of FIG. 7, the DC offset of operational amplifier U2 is set to reduce the "in-phase" component of the carrier leakage, balun transformers BT1 and BT2 reduce the parasitic coupling between carrier signal port 10 and modulated signal port 14 by lowering the average voltage at ports 10 and 14, and variable capacitor CV13 of reactance network 24 is adjusted to cancel the "quadrature-phase" component of the carrier leakage.

In practice, adjustments to the DC offset of operational amplifier U2 and variable capacitor CV13 are performed iteratively, in the same manner as hulling a classical impedance bridge. For example, one method to determine the optimal adjustments would be to connect a 50-ohm sensor to the modulated signal port 14, apply a normal magnitude signal (typically $+7$ dBm $=5$ mW) to the carrier signal port 10, and short the modulating signal port 12 to ground to provide a modulating input signal of zero. Because the final null will be a very low signal requiring a narrow-band sensor to resolve the carrier leakage above the noise floor, a spectrum analyzer tuned to the carrier frequency should be used to measure the output at the modulated signal port 14. After making the above connections, it is necessary to adjust the DC offset for lowest output power, and then adjust the capacitance of the variable capacitor to improve the null. By this process, the carrier leakage can be reduced to a level below the noise floor in a small number of iterations.

It is noted that in the practical double-balanced modulator incorporating the carrier rejection circuit of the present invention, the above adjustment may drift over time due to temperature-induced drift of the capacitors. In experiments in which the modulator circuit and the carrier rejection circuit of the present invention were housed in a shielded box to minimize interaction between the circuit elements and the outside environment, the inventors were able to achieve a carrier leakage value of below $-133$ dBm, relative to an initial value of $-112$ dBm. After a few hours of operation, it is conceivable that this value may degrade to $-125$ dBm. The manufacturer of the device used in this experiment quotes a typical value of about $-60$ dBm for this output power at the RF port, when the modulator is used with the normal connections and $+7$ dBm input power is applied to the LO port. The value of this leakage power depends on the LO frequency.

Other embodiments of the invention will be apparent to those skilled in the art from consideration of the specification and practice of the invention disclosed herein. For instance, the present invention has been described in this specification, for purposes of example, in conjunction with a diode-ring modulator. However, one skilled in the art will recognize the utility of the present invention for practice with other types of modulator circuits. Thus, it is intended that the specification and examples be considered as exemplary only, with the true scope and spirit of the invention being indicated by the following claims.

What is claimed is:

1. A carrier rejection circuit for improving carrier rejection in a balanced modulator, the balanced modulator including a carrier signal port for receiving a carrier signal, a modulating signal port for receiving a modulating signal, and modulating means for modulating the carrier signal according to the modulating signal to generate a modulated signal at a modulated signal port, the carrier rejection circuit comprising:

balance means, connected to the carrier signal port and the modulated signal port, for balancing the carrier signal and the modulated signal with respect to a ground potential, the balance means reducing parasitic carrier leakage between the carrier signal port and the modulated signal port by reducing the average voltages at the carrier signal port and the modulated signal port;

offset means, connected to the modulating signal port, for applying an adjustable offset voltage to the modulating signal to reduce carrier leakage caused by offset voltage at the modulating signal port and in-phase parasitic carrier leakage between the carrier signal port and the modulated signal port; and reactance network means, connected between the carrier signal port and the modulated signal port, for reducing quadrature-phase parasitic carrier leakage between the carrier signal port and the modulated signal port.

2. The carrier rejection circuit of claim 1, wherein the reactive network means includes at least one variable capacitor for adjusting the reactance of the reactance network means.

3. The carrier rejection circuit of claim 2, wherein the balanced modulator includes resistor means for terminating each of the carrier signal port, modulating signal port, and modulated signal port to the ground potential.

4. The carrier rejection circuit of claim 1, wherein the balanced modulator includes an input transformer having a first input terminal connected to the ground potential via the balance means and a second input terminal receiving the carrier signal from the carrier signal port via the balance means, and an output transformer having a first output terminal connected to the ground potential via the balance means and a second output terminal at which the modulated signal is generated.

5. The carrier rejection circuit of claim 4, wherein the reactance network means includes:

a first capacitor connected between the first input terminal and the first output terminal; and a second capacitor connected between the second input terminal and the second output terminal.

6. The carrier rejection circuit of claim 5, wherein the first and second capacitors are variable capacitors.

7. The carrier rejection circuit of claim 5, wherein the reactance network means further includes:
   a third capacitor connected between the first input terminal and the second output terminal;
   and a fourth capacitor connected between the second input terminal and the first output terminal.

8. The carrier rejection circuit of claim 7, wherein the first and second capacitors are variable capacitors.

9. The carrier rejection circuit of claim 4, wherein the reactance network means includes:
   first and second capacitors connected in series between the first input terminal and the first output terminal, the first and second capacitors connected to each other at a first node;
   third and fourth capacitors connected in series between the second input terminal and the second output terminal, the third and fourth capacitors connected to each other at a second node; and
   a fifth capacitor connected between the first node and the second node.

10. The carrier rejection circuit of claim 9, wherein the fifth capacitor is a variable capacitor.

11. The carrier rejection circuit of claim 4, wherein the reactance network means includes:
    first and second capacitors connected in series between the second input terminal and the first output terminal, the first and second capacitors connected to each other at a first node;
    third and fourth capacitors connected in series between the first input terminal and the second output terminal, the third and fourth capacitors connected to each other at a second node;
    fifth and sixth capacitors connected in series between the first input terminal and the first output terminal, the fifth and sixth capacitors connected to each other at a third node;
    seventh and eighth capacitors connected in series between the second input terminal and the second output terminal, the seventh and eighth capacitors connected to each other at a fourth node;
    a ninth capacitor connected between the first node and the second node; and
    a tenth capacitor connected between the third node and the fourth node.

12. The carrier rejection circuit of claim 11, wherein the ninth capacitor is a variable capacitor.

13. The carrier rejection circuit of claim 11, wherein the reactance network means further includes an eleventh capacitor connected in parallel with the ninth capacitor between the first node and the second node.

14. The carrier rejection circuit of claim 13, wherein the ninth capacitor is a variable capacitor.

15. The carrier rejection circuit of claim 4, wherein the balance means includes an input balun transformer connected to the carrier signal port and an output balun transformer connected to the modulated signal port.

16. The carrier rejection circuit of claim 4, wherein the reactance network means includes:
    first and second capacitors connected in series between the first input terminal and the first output terminal, the first and second capacitors connected to each other at a first node;
    third and fourth capacitors connected in series between the second input terminal and the second output terminal, the third and fourth capacitors connected to each other at a second node;
    a fifth capacitor connected between the first input terminal and the second output terminal;
    a sixth capacitor connected between the second input terminal and the first output terminal; and
    a seventh capacitor connected between the first and second nodes.

17. The carrier rejection circuit of claim 16, wherein the seventh capacitor is a variable capacitor.

18. The carrier rejection circuit of claim 16, wherein the fifth and sixth capacitors are variable capacitors.

19. The carrier rejection circuit of claim 1, wherein the balanced modulator is a diode ring modulator.

20. The carrier rejection circuit of claim 1, wherein the offset means includes an operational amplifier circuit coupling the modulating signal to the balanced modulator, the operational amplifier circuit including an operational amplifier having DC offset adjustment means for adjusting the DC offset of the operational amplifier to control the magnitude and polarity of the adjustable offset voltage applied to the modulating signal.

21. A carrier rejection circuit for improving carrier rejection in a balanced modulator, the balanced modulator including a carrier signal port for receiving a carrier signal, a modulating signal port for receiving a modulating signal, and modulating means for modulating the carrier signal according to the modulating signal to generate a modulated signal at a modulated signal port, the carrier rejection circuit comprising:
    balance means, coupled to the carrier signal port and the modulated signal port, for balancing the carrier signal and the modulated signal with respect to a ground potential, the balance means reducing parasitic carrier leakage between the carrier signal port and the modulated signal port by reducing the average voltages at the carrier signal port and the modulated signal port.

22. The carrier rejection circuit of claim 21, further comprising:
    offset means, coupled to the modulating signal port, for applying an adjustable offset voltage to the modulating signal to reduce carrier leakage caused by offset voltage at the modulating signal port and in-phase parasitic carrier leakage between the carrier signal port and the modulated signal port.

23. The balanced modulator circuit of claim 21, further comprising:
    reactance network means, coupled between the carrier signal port and the modulated signal port, for reducing quadrature-phase parasitic carrier leakage between the carrier signal port and the modulated signal port.

* * * * *